United States Patent
Grupp et al.

(10) Patent No.: US 7,284,172 B2
(45) Date of Patent: Oct. 16, 2007

(54) ACCESS METHOD FOR EMBEDDED JTAG TAP CONTROLLER INSTRUCTION REGISTERS

(75) Inventors: Richard J. Grupp, Milton, VT (US); Gary L. Kunselman, Milton, VT (US); Steven F. Oakland, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 10/709,389

(22) Filed: Apr. 30, 2004

(65) Prior Publication Data

US 2005/0257108 A1   Nov. 17, 2005

(51) Int. Cl.
*G01R 31/28* (2006.01)
(52) U.S. Cl. .................... 714/726; 714/727
(58) Field of Classification Search .................. None
See application file for complete search history.

(56) References Cited

U.S. PATENT DOCUMENTS

| | | | |
|---|---|---|---|
| 4,947,357 A | 8/1990 | Stewart et al. | |
| 4,947,395 A | 8/1990 | Bullinger et al. | |
| 5,423,050 A | 6/1995 | Taylor et al. | |
| 5,497,378 A | 3/1996 | Amini et al. | |
| 5,706,297 A | 1/1998 | Jeppesen et al. | |
| 5,805,609 A | 9/1998 | Mote, Jr. | |
| 6,088,822 A | 7/2000 | Warren | |
| 6,311,302 B1 | 10/2001 | Cassetti et al. | |
| 6,334,198 B1 | 12/2001 | Adusumilli et al. | |
| 6,421,812 B1 | 7/2002 | Wang et al. | |
| 6,477,691 B1 | 11/2002 | Bergamashi/Rab et al. | |
| 6,829,730 B2 * | 12/2004 | Nadeau-Dostie et al. | ..... 714/30 |
| 7,073,110 B1 * | 7/2006 | Jacobson | ..... 714/726 |
| 7,111,217 B1 * | 9/2006 | Schultz | ..... 714/727 |

* cited by examiner

*Primary Examiner*—Guy Lamarre
*Assistant Examiner*—John J. Tabone, Jr.
(74) *Attorney, Agent, or Firm*—Gibb & Rahman, LLC; Michael LeStrange, Esq.

(57) ABSTRACT

Disclosed is an integrated circuit chip structure that has a chip level test access port (TAP) controller and a plurality of embedded TAPs connected to the chip level TAP. Because the embedded TAPs have lengths that differ from the chip level TAP IR, and the embedded TAP IR lengths may differ from each, the chip level TAP includes a flexible length instruction register architecture adapted to accommodate the different length instruction registers of the embedded TAPs while using a constant length chip level instruction register definition for all IR accesses through the chip level TAP. Further, the invention includes selection logic adapted to actively connect only a single embedded TAP to the chip level TAP at a time.

25 Claims, 3 Drawing Sheets

ACCESS METHOD FOR EMBEDDED JTAG TAP CONTROLLER INSTRUCTION REGISTERS

BACKGROUND OF THE INVENTION

1. Field of the Invention

The present invention generally relates to an integrated circuit chip structure that has a chip level test access port (TAP) controller and more particularly to a chip that also includes a plurality of embedded TAPs connected to the chip level TAP. Because the embedded TAPs have instruction register (IR) lengths that differ from the chip level TAP IR, and the embedded TAP IR lengths may differ from each other, the chip level TAP includes a flexible length instruction register architecture designed to accommodate the different length instruction registers of the embedded TAPs while using a constant length chip level instruction register definition for all IR accesses through the chip level TAP.

2. Description of the Related Art

As explained in U.S. Pat. No. 6,334,198 (incorporated herein are reference), the electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A wide variety of techniques have been used in IC devices to ensure that, once they are manufactured, they operate fully in compliance with their intended design and implementation specifications. Many of the more complex IC designs include circuits that permit in-circuit testing via the IC access pins. The IEEE 1149.1 JTAG recommendation, for example, provides a test circuit architecture for use inside such ICs. This architecture includes a test access port (TAP) controller coupled to the IC pins for providing access to and for controlling various standard features designed into such ICs. Some of these features are internal scan, boundary scan, built-in test, and emulation.

The JTAG recommendation was developed with the understanding that such IC designs would be using only one TAP controller. Sometime after the TAPs, initial development, however, many IC's were designed with multiple "core" circuits, such as multiple CPUs, with each core circuit including its own TAP controller. Typically, separate IC pins are used to select one of the TAP controllers for testing and/or debugging the IC. This is problematic, however, in IC applications that require an increasing number of core circuits without increasing the circuit area of the IC and/or the number of IC pins.

ASIC (application specific integrated circuit) devices, usually contain a single JTAG TAP controller for access and control of board level tests of I/O continuity. Access to user defined functions can also be supported using the chip level TAP controller and private instruction definitions. When integrating large intellectual property (IP) blocks into today's ASICs there is the possibility that such IP will have embedded JTAG access through a self contained TAP controller. Access methods for embedded TAP functions are not covered in the IEEE 1149.1 JTAG specification. Methods have evolved, independent of the IEEE 1149.1 specification, that enable access to embedded TAP controllers through the use of various implementations of compliance enable logic and private instruction definitions in the ASICs chip level TAP controller. These methods strive to maintain IEEE 1149.1 JTAG compliance; however, one limitation of these existing methods is the inability to shift out (or read) differing length embedded TAP instruction registers with a single chip level instruction register length definition as is required for IEEE 1149.1 compliance.

This invention described below allows IEEE 1149.1 compliant shifting out (reading) of embedded JTAG TAP controller instruction register (IR) contents, contained in IP blocks on ASIC chips, while using a constant length chip level instruction register definition for all IR accesses through the chip level TAP.

SUMMARY OF THE INVENTION

This disclosure presents an integrated circuit chip structure that has a chip level test access port (TAP) controller and a plurality of embedded TAPs connected to the chip level TAP. Because the embedded TAPs have instruction register lengths that differ from the chip level TAP IR, and the embedded TAP IR lengths may differ from each other, the chip level TAP includes a flexible length instruction register architecture designed to accommodate the different length instruction registers of the embedded TAPs, while using a constant length chip level instruction register definition for all IR accesses through the chip level TAP. Further, the invention includes selection logic adapted to actively connect only a single embedded TAP to the chip level TAP at a time.

This chip-level flexible length instruction register length is longer than the longest embedded TAP instruction register, and the additional bits that make the flexible length instruction register longer than the longest embedded TAP instruction register comprises bits that are adapted to choose the active length of the flexible length instruction register.

The inventive flexible length instruction register comprises of several segments of register bits, including a plurality of multiplexers used to selectively concatenate or bypass the register segments with the selected embedded TAP instruction register bits, maintaining a constant length chip-level TAP instruction register. The length of the register segments are, for example in one embodiment, a first instruction register segment having the same length as the shortest embedded TAP instruction register, and a second instruction register segment having a length equal to the difference between the shortest embedded TAP instruction register and a larger embedded TAP instruction register. More generally, the flexible length instruction register comprises additional instruction registers segments having incremental lengths equal to the difference between the previous shorter embedded TAP instruction register and the next largest embedded TAP instruction register.

The invention includes a plurality of multiplexors connected to the additional instruction registers segments, wherein the multiplexors are adapted to selectively include incremental ones of the additional instruction registers segments to incrementally match the difference in length of longer embedded TAP instruction registers and the chip-level TAP instruction register. Thus, the active length of the flexible length instruction register comprises the selected embedded TAP instruction register bits combined with selected ones of the additional instruction registers segments of the chip-level TAP instruction register.

One benefit of the invention is that the flexible length instruction register appears as a fixed length instruction register to users connecting to the chip level TAP. Therefore, the invention allows IEEE 1149.1 compliant access (reading) of embedded JTAG TAP controller instruction register (IR) contents, contained in IP blocks on ASIC chips, while using a constant length chip level instruction register definition for all IR accesses through the chip level TAP. More specifically, the invention allows positional bit replacement of the chip level TAP IR data with embedded TAP IR data. The new architecture allows for a single IR length definition to represent and access all embedded and chip level TAP instruction registers. These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
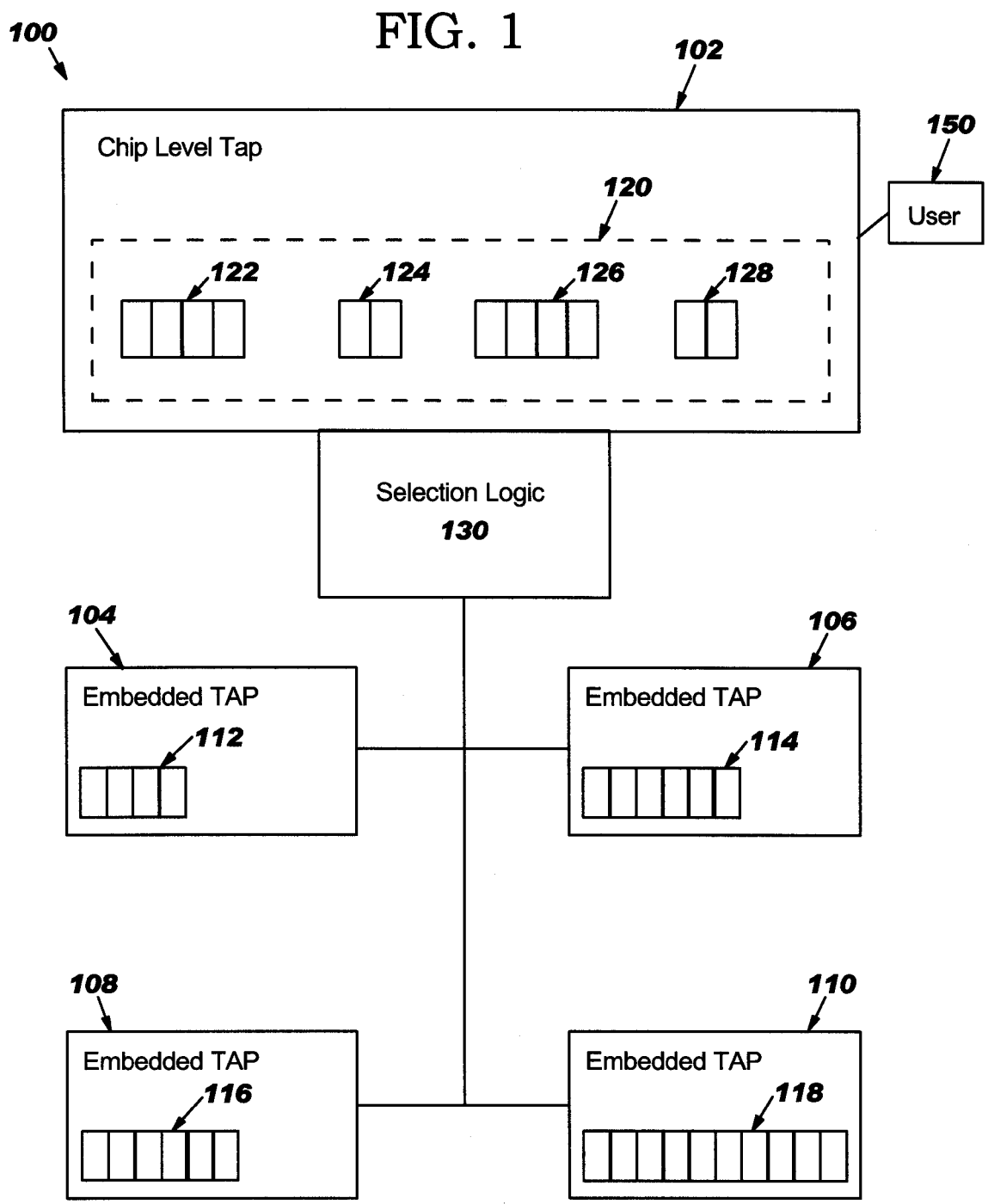
FIG. 1 is a conceptual diagram of the chip level and embedded TAPs used with the inventive structure.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

FIG. 1 illustrates a first embodiment of the inventive integrated circuit chip structure. As shown in FIG. 1, the chip 100 (which can be, for example an ASIC) includes a chip level test access port (TAP) controller 102 and a plurality of embedded TAPs 104-110 connected to the chip level TAP. A user 150 will access the data within the embedded TAPs 104-110 through the chip level TAP controller 102. Note that the length of the instruction registers 112-118 within each of the embedded TAPs is inconsistent. For example, instruction register 112 is four bits long, instruction registers 114 and 116 are six bits long, and instruction register 118 is ten bits long.

Because the embedded TAPs have different length instruction registers, the chip level TAP includes a flexible length instruction register architecture 120 adapted to accommodate the different length instruction registers 112-118 of the embedded TAPs 104-110. Further, the invention includes selection logic 130 adapted to actively connect only a single embedded TAP to the chip level TAP 102 at a time.

The inventive flexible length instruction register 120 has, for example in one embodiment, a first instruction register segment 122 having the same length (e.g., 4 bits) as the shortest embedded TAP instruction register 112, and an additional instruction registers segment (e.g., 2 bit register segment 124) that has an incremental lengths equal to the difference between the previous shorter four bit embedded TAP instruction register 112 and the next largest six bit embedded TAP instruction registers 114, 116, and a third additional instruction register segment (e.g. 4 bit register segment 126) that has an incremental length equal to the difference between the sum of the previous register segments 124 and 122 and the length of embedded TAP instruction register 118. Therefore, when connected to embedded register 118, the invention only actively utilizes the last instruction register segment 128 to shift out (read) the data from the embedded register 118. To the contrary, the invention will utilize both the last and next to last instruction registers segments 128 and 126 to make the flexible length instruction register 120 six bits long, when shifting out data from the six bit embedded registers 114, 116. Similarly, when reading out data from the four bit embedded TAP instruction register 112, the flexible length instruction register 120 will become eight bits in length by engaging the last three instruction register segments 124, 126 and 128. When accessing the chip level TAP, the flexible length instruction register 120 will become a 12 bit instruction register by engaging all four instruction register segments 122-128.

The flexible length instruction register 120 is longer than the longest embedded TAP instruction register. More specifically, the flexible length instruction register 120 has a total of 12 bits divided into separate registers 122-128. The additional bits 128 that make the flexible length instruction register longer than the longest embedded TAP instruction register (e.g., 10 bit register 118) comprises bits 128 that are adapted to choose the effective (active) length of the flexible length instruction register. The selection logic 130 uses the information within the additional bits 128 to identify which embedded TAP will be connected to the chip level TAP 120 and which corresponding registers segments 122-126 will be utilized within the flexible length instruction register 120 to access (shift out) the data from the selected embedded TAP.

The integrated circuit chip 100 shown in FIG. 1 includes four embedded TAPs 104-110 and three different length instruction registers; however, as would be understood by one ordinarily skilled in the art in light of this disclosure, any number of embedded TAPs and any number of different length instruction registers could be accommodated with the invention, and the invention is not limited to the specific examples used herein. Further, the selection logic 130 could comprise a wide variety of logic devices as would be understood by one ordinarily skilled in the art. For example, selection logic 130 could include a plurality of multiplexors connected to the instruction registers segments 122-126, wherein the multiplexors could selectively include incremental ones of the additional instruction registers segments to incrementally match the difference in length of the embedded TAPs instruction registers and the chip level TAP IR length definition. Thus, the active length of the flexible length instruction register 120 comprises the length of the additional bits 128 combined with selected ones of the additional instruction registers segments 122-126.

Figure 2:
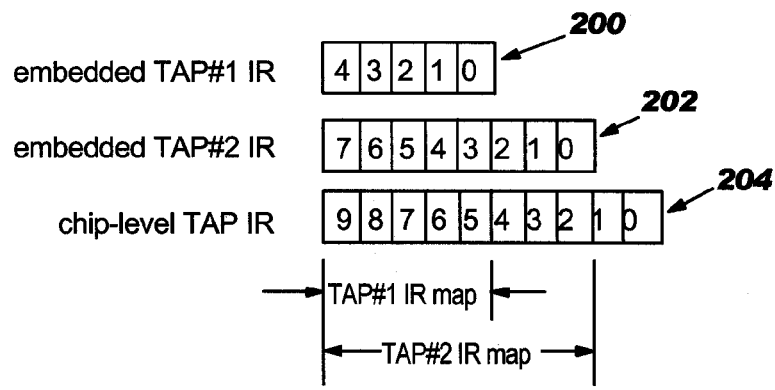
FIG. 2 is a schematic diagram of different length instruction registers included within the chip level and embedded TAPs.
Figure 3:
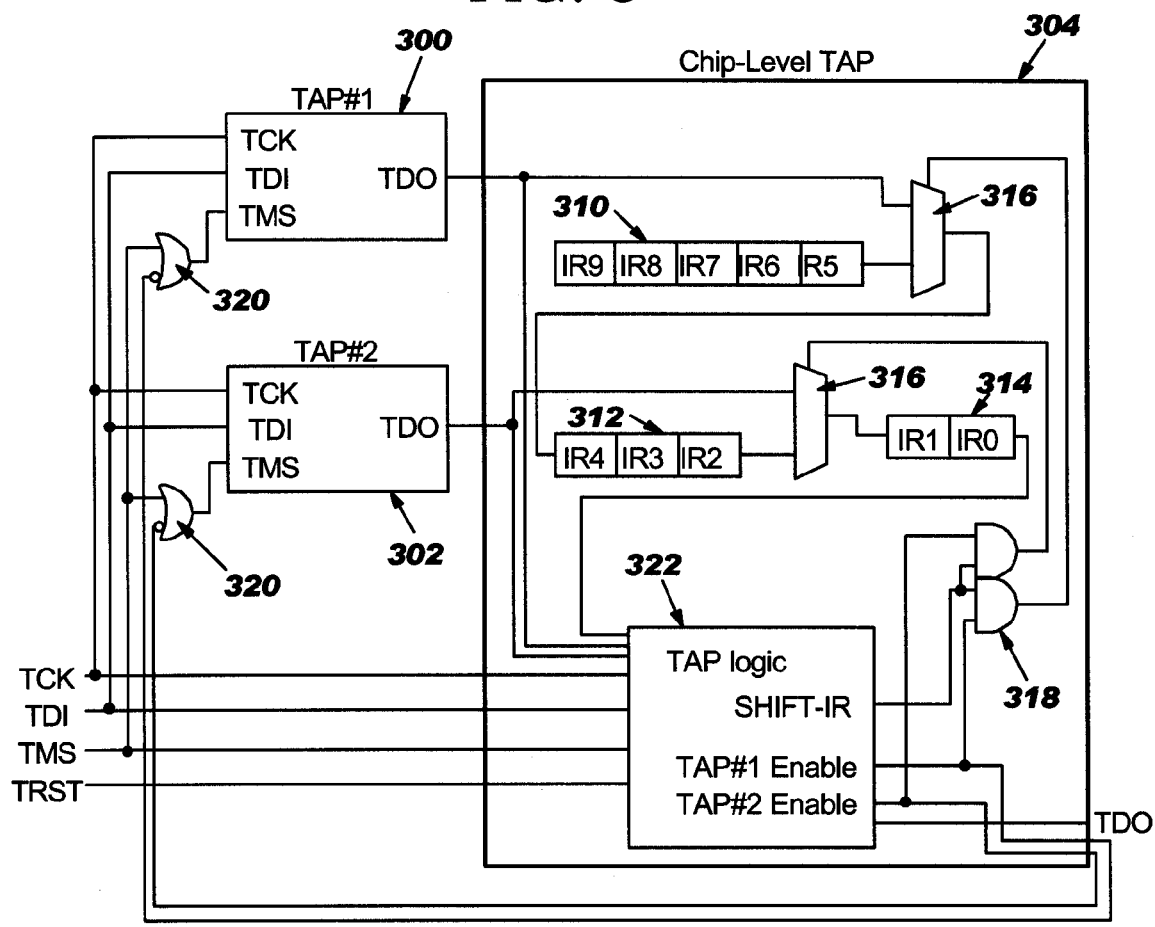
FIG. 3 is a schematic diagram of the chip level and embedded TAPs used with the inventive structure.

FIGS. 2 and 3 illustrate a more specific schematic circuit diagram of the invention as it would apply to an integrated circuit chip that included two embedded TAPs 300, 302. More specifically, FIG. 2 illustrates the instruction shift registers 200-204 that are found within the first embedded TAP 300, second embedded TAP 302, and the chip level TAP 304, respectively, that are shown in FIG. 3.

A given embedded TAP instruction register 200, 202 "maps" onto the chip-level instruction register 310-314 starting at the most significant bit (MSB) such as bit 9 of the IR definition and proceeding downwards as shown in FIG. 2. FIG. 2 illustrates two embedded TAP IRs 200, 202 that are 5 and 8 bits in length, respectively, for embedded TAP #1 300 and embedded TAP #2 302. As shown in FIG. 3, the chip-level TAP IR is 10 bits in length (L=K+D) where K is equal to the total of the individual shift registers 310, 312 and D is equal to the number of additional control bits 314. More specifically, the chip-level TAP instruction register is designed with a length L=K+D, where K>=(length of longest instruction register, or string of instruction registers if serially connected, among TAPS in embedded IP blocks) and 2D>N, where N=(# of TAPs in embedded IP blocks). The D low-order bits of the instruction register will be used for selecting access to the TAP within one of the N IP blocks or for selecting a chip-level instruction.

FIG. 3 shows that when a TAP controller of embedded IP blocks is accessed by the decoded D low-order bits 314 of the instruction register (bits[1:0]), and the SHIFT-IR state is entered by the chip-level TAP controller 304, the chip-level TAP IR is instructed (by the TAP logic unit 322) to connect the embedded TAP test data output (TDO) signal in place of the instruction register bit corresponding to the length of the chip-level IR, less the length of the selected embedded TAP IR. For embedded TAP #1, as defined above, this is bit 5 (10-5), IR5 shown in FIG. 2; for embedded TAP #2, this is bit 2 (10-8), IR2 shown in FIG. 2.

With respect to the additional structure shown in FIG. 3, the TAP logic unit 322 can receive a number of different inputs including a test clock signal (TCK), a test data input (TDI), the low order bits (IR1, IR0) that identify which, if any, embedded TAP controller will be accessed, a test mode select signal (TMS) that controls test operations, and a test reset signal (TRST). Using these inputs, the TAP logic controller 322 controls AND gates 318, which in turn control multiplexors 316 to selectively utilize none, one, or both of the shift register 310, 312. The same control signals that are sent to AND gates 318 are also provided to the OR gates 320 to enable or disable the embedded TAP controllers 300, 302 so that no more than one of the embedded TAP controllers is providing data to the chip-level TAP at a time.

The structure shown in FIG. 3 allows the TAP controller, in the selected embedded IP block, to track synchronously, state for state, with the chip-level TAP controller logical state. Since the selected embedded TAP controller and the chip-level TAP controller will be running synchronously, when a SHIFT-IR state is entered by the chip-level TAP logic 322, it is also entered in the selected embedded TAP controller. Under these conditions the IR shift out of the chip-level TAP controller will match the "mapped" definition shown in FIG. 2. As shown in FIG. 3, with embedded TAP #1 300 selected, the first 5 bits will come from the chip-level TAP IR segments 312, 314 and the last 5 bits will come from the embedded TAP IR 300 rather then from register segment 310. In a similar manner, if TAP #2 302 is being accessed, its eight bits of data will be preceded by the two bits from the chip-level TAP instruction register segment 314.

Figure 4:
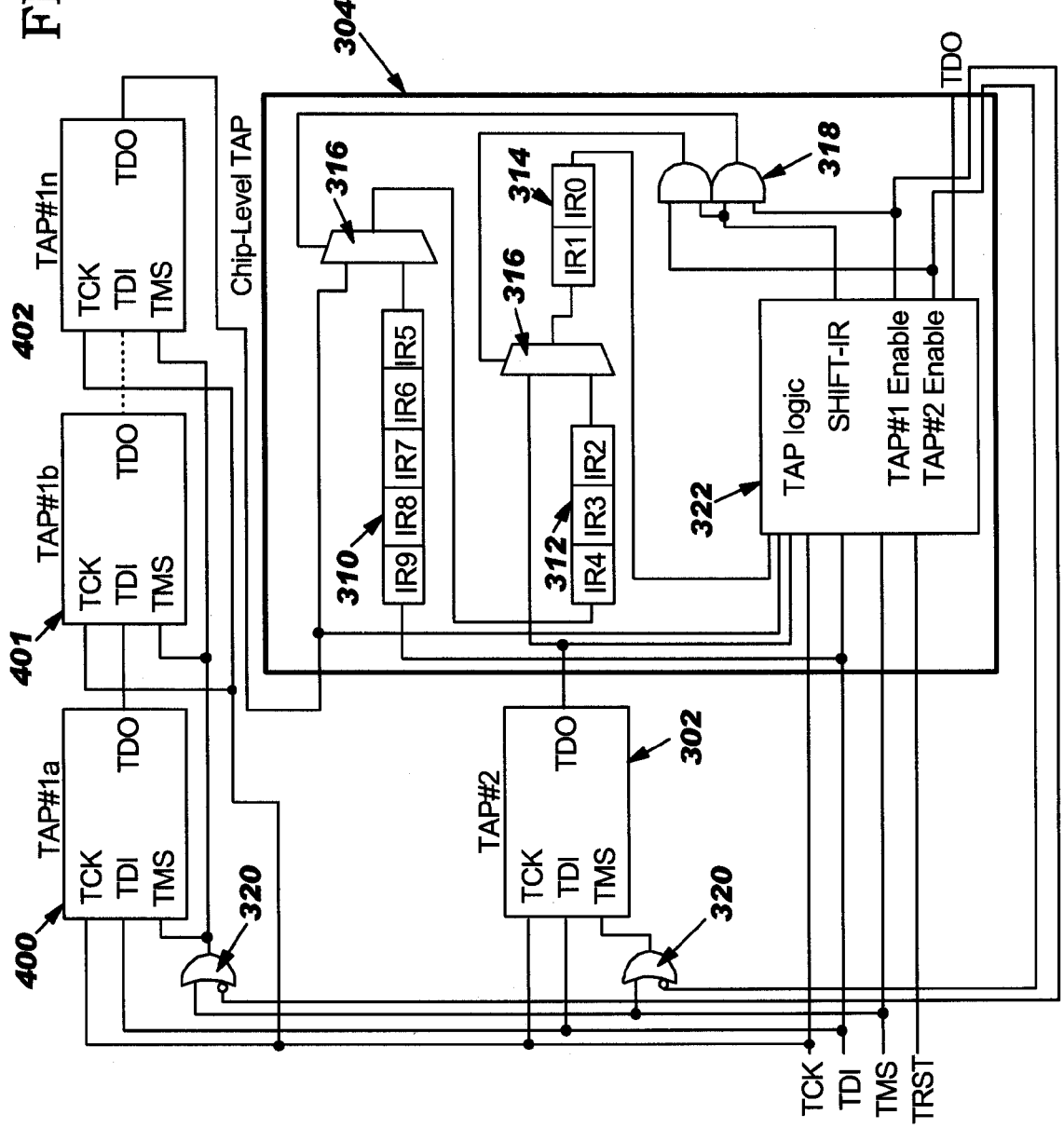
FIG. 4 is a schematic diagram of the chip level and embedded TAPs used with the inventive structure.

While the invention has been described in terms of selecting between two TAPs of differing instruction register lengths, those skilled in the art will recognize that the invention also applies equally to a single embedded tap or to multiple serial strings of embedded TAPs, as shown in FIG. 4. The length of the instruction register of TAP string #2 is the sum of the lengths of instruction registers in embedded TAPs #1*a*, 1*b* . . . I*n*, 400-402.

Therefore, as shown above, one benefit of the invention is that the flexible length instruction register appears as a fixed length instruction register to users connecting to the chip level TAP. Therefore, the invention allows IEEE 1149.1 compliant access (reading) of embedded JTAG TAP controller instruction register (IR) contents, contained in IP blocks on ASIC chips, while using a constant length chip level instruction register definition for all IR accesses through the chip level TAP. More specifically, the invention allows positional bit replacement of the chip level TAP IR data with embedded TAP IR data. The inventive architecture allows for a single IR length definition to represent and access all embedded and chip level TAP instruction registers.

In the invention, there is no need for chip-level Compliance-Enable (CE) pins (the invention maintains compliance to the Standard while solving a problem not addressed by the Standard). The invention does not add to board-test complexity (control/access to CE pins). Further, in the invention, no special treatment is needed at test time or during functional operation. The invention does not require multiple BSDL files to account for different instruction register lengths. The invention eliminates need for extra I/O dedicated to test.

While the invention has been described in terms of preferred embodiments, those skilled in the art will recognize that the invention can be practiced with modification within the spirit and scope of the appended claims.

What is claimed is:

1. An integrated circuit structure comprising:
a chip-level test access port (TAP) controller having a chip-level TAP instruction register; and
a plurality of embedded TAPs connected to said chip-level TAP controller,
wherein said embedded TAPs have instruction register lengths that differ from said chip-level TAP instruction register,
wherein said chip-level TAP instruction register comprises a flexible length instruction register,
wherein said flexible length instruction register comprises a plurality of instruction register segments,
wherein at least two of said instruction register segments comprise multiple bits,
wherein said flexible length instruction register is adapted to accommodate different length instruction registers of said embedded TAPs,
wherein said flexible length instruction register is longer than a longest embedded TAP instruction register,
wherein said flexible length instruction register further comprises additional bit segments,
wherein all of said instruction register segments combined are as long as said longest embedded TAP instruction register,
wherein said additional bit segments make said flexible length instruction register longer than said longest embedded TAP instruction register, and
wherein said additional bit segments comprise bits that are adapted to choose an effective length of said flexible length instruction register.

2. The integrated circuit structure in claim 1, wherein said plurality of instruction register segments comprise:
- a first instruction register segment having a same length as a shortest embedded TAP instruction register; and
- a second instruction register segment having a length equal to a difference between said shortest embedded TAP instruction register and a next longer embedded-TAP instruction register.

3. The integrated circuit structure in claim 1, wherein said plurality of instruction register segments comprises:
- a first instruction register segment having a same length as a shortest embedded TAP instruction register; and
- at least two other instruction register segments having lengths equal to a difference between a previous shorter embedded TAP instruction register and a next-longer embedded TAP instruction register.

4. The integrated circuit structure in claim 3, further comprising a selection logic connected to each of said instruction register segments and to said additional bit segments, wherein said selection logic comprises a plurality of multiplexors adapted to selectively include with said first instruction register segment incremental ones of said instruction register segments to incrementally match a difference in length between longer embedded TAP instruction registers and said first instruction register segment.

5. The integrated circuit structure in claim 3, wherein said effective length of said flexible length instruction register comprises a combined length of said first instruction register segment and selected ones of said at least two other instruction registers segments.

6. The integrated circuit structure in claim 1, wherein said flexible length instruction register appears as a fixed length instruction register to users connecting to said chip-level TAP controller.

7. The integrated circuit structure in claim 1, further comprising a selection logic adapted to actively connect only a single embedded TAP at a time to said chip-level TAP controller.

8. An integrated circuit structure comprising:
- a chip-level test access port (TAP) controller having a chip-level TAP instruction register; and
- a plurality of embedded TAPs connected to said chip-level TAP controller,
- wherein said embedded TAPs have instruction register lengths that differ from said chip-level TAP instruction register,
- wherein at least some of said embedded TAP instruction register lengths differ from each other,
- wherein said chip-level TAP instruction register comprises a flexible length instruction register,
- wherein said flexible length instruction register is adapted to accommodate different length instruction registers of said embedded TAPs,
- wherein said flexible length instruction register comprises:
  - a plurality of instruction register segments at least two of which comprise multiple bits; and
  - additional bit segments,
- wherein said plurality of instruction register segments comprise:
  - a first instruction register segment having a same length as a shortest embedded TAP instruction register; and
  - a second instruction register segment having a length equal to a difference between said shortest embedded TAP instruction register and a next longer embedded TAP instruction register,
- wherein all of said instruction register segments combined are as long as a longest embedded TAP instruction register,
- wherein said additional bit segments make said flexible length instruction register longer than said longest embedded TAP instruction register, and
- wherein said additional bit segments comprise bits that are adapted to choose an effective length of said flexible length instruction register.

9. The integrated circuit structure in claim 8, wherein said flexible length instruction register appears as a fixed length instruction register to users connecting to said chip-level TAP controller.

10. The integrated circuit structure in claim 8, further comprising a selection logic adapted to actively connect only a single embedded TAP at a time to said chip-level TAP controller.

11. An integrated circuit structure comprising:
- a chip-level test access port (TAP) controller having a chip-level TAP instruction register; and
- a plurality of embedded TAPs connected to said chip-level TAP controller,
- wherein said embedded TAPs have instruction register lengths that differ from said chip-level TAP instruction register,
- wherein at least some of the embedded TAP instruction register lengths differ from each other,
- wherein said chip-level TAP instruction register comprises a flexible length instruction register,
- wherein said flexible length instruction register is adapted to accommodate different length instruction registers of said embedded TAPs,
- wherein said flexible length instruction register comprises a plurality of instruction register segments having a combined length equal to a longest embedded TAP instruction register and additional bit segments such that said flexible length instruction register is longer than said longest embedded TAP instruction register,
- wherein said plurality of instruction register segments comprise:
  - a first instruction register segment comprising multiple bits and having a same length as a shortest embedded TAP instruction register; and
  - at least two other instruction register segments having lengths equal to a difference between a previous shorter embedded TAP instruction register and a next-longer embedded TAP instruction register, wherein at least one of said at least two other instruction register segments comprises multiple bits.

12. The integrated circuit structure in claim 11, wherein said additional bit segments are adapted to choose an effective length of said flexible length instruction register.

13. The integrated circuit structure in claim 11, further comprising a selection logic connected to each of said instruction register segments and to said additional bit segments, wherein said selection logic comprises a plurality of multiplexors adapted to selectively include with said first instruction register segment incremental ones of said instruction register segments to incrementally match a difference in length between longer embedded TAPs instruction registers and said first instruction register segment.

14. The integrated circuit structure in claim 12, wherein said effective length of said flexible length instruction register comprises a combined length of said first instruction register segment and selected ones of said at least two other instruction register segments.

15. The integrated circuit structure in claim 11, wherein said flexible length instruction register appears as a fixed length instruction register to users connecting to said chip-level TAP controller.

16. The integrated circuit structure in claim 11, further comprising a selection logic adapted to actively connect only a single embedded TAP at a time to said chip-level TAP controller.

17. An integrated circuit structure comprising:
a chip-level test access port (TAP) controller, having a chip-level TAP instruction register; and
a plurality of embedded TAPs connected to said chip-level TAP controller,
wherein said embedded TAPs have instruction register lengths that differ from said chip-level TAP instruction register,
wherein at least some of the embedded TAP instruction register lengths may differ from each other,
wherein said chip-level TAP instruction register comprises a flexible length instruction register adapted to accommodate different length instruction registers of said embedded TAPs,
wherein said flexible length instruction register comprises a plurality of instruction register segments having a combined length equal to a longest embedded TAP instruction register and additional bit segments such that said flexible length instruction register is longer than the longest embedded TAP instruction register,
wherein said additional bit segments are adapted to choose an effective length of said flexible length instruction register.

18. The integrated circuit structure in claim 17,
wherein at least two of said plurality of instruction register segments comprise multiple bits and
wherein said plurality of instruction register segments further comprises:
a first instruction register segment having a same length as a shortest embedded TAP instruction register; and
a second instruction register segment having a length equal to a difference between said shortest embedded TAP instruction register and a next longer embedded TAP instruction register.

19. The integrated circuit structure in claim 17, wherein said plurality of instruction register segments comprises:
a first instruction register segment having the same length as a shortest embedded TAP instruction register; and
at least two other instruction registers segments having lengths equal to a difference between a previous shorter embedded TAP instruction register and a next longer embedded TAP instruction register, wherein at least one of said at least two other instruction register segments comprises multiple bits.

20. The integrated circuit structure in claim 19, further comprising a selection logic connected to each of said instruction register segments and to said additional bit segments, wherein said selection logic comprises a plurality of multiplexors adapted to selectively include with said first instruction register segment incremental ones of said instruction register segments to incrementally match a difference in length between longer embedded TAPs instruction registers and said first instruction register segment.

21. The integrated circuit structure in claim 19, wherein said effective length of said flexible length instruction register comprises a combined length of said first instruction register segment and selected ones of said at least two other instruction registers segments.

22. The integrated circuit structure in claim 17, wherein said flexible length instruction register appears as a fixed length instruction register to users connecting to said chip-level TAP controller.

23. The integrated circuit structure in claim 17, further comprising a selection logic adapted to actively connect only a single embedded TAP at a time to said chip-level TAP controller.

24. The integrated circuit structure in claim 17, wherein said embedded TAPs comprise serially connected TAPs.

25. The integrated circuit structure in claim 17, wherein a number of said embedded TAPs is unlimited.

* * * * *